United States Patent [19]
Shigihara

[11] Patent Number: 5,675,597
[45] Date of Patent: Oct. 7, 1997

[54] SEMICONDUCTOR LASER DEVICE

[75] Inventor: Kimio Shigihara, Itami, Japan

[73] Assignee: Mitsubishi Denki Kabushiki Kaisha, Tokyo, Japan

[21] Appl. No.: 551,427

[22] Filed: Nov. 1, 1995

[30] Foreign Application Priority Data

Nov. 16, 1994 [JP] Japan ................. 6-281811

[51] Int. Cl.$^6$ ............................................. H01S 3/10
[52] U.S. Cl. ........................ 372/29; 372/36; 372/109
[58] Field of Search ........................ 372/36, 109, 31, 372/29

[56] References Cited

U.S. PATENT DOCUMENTS

| | | |
|---|---|---|
| 4,768,070 | 8/1988 | Takizawa et al. ............... 372/75 |
| 4,954,853 | 9/1990 | Yoshida et al. ................ 372/75 |
| 5,500,768 | 3/1996 | Doggett et al. ............... 359/811 |
| 5,519,720 | 5/1996 | Hirano et al. ................ 372/43 |

FOREIGN PATENT DOCUMENTS

| | | |
|---|---|---|
| 60-31285 | 2/1985 | Japan . |
| 60-35593 | 2/1985 | Japan . |
| 1256189 | 10/1989 | Japan . |
| 2165684 | 6/1990 | Japan . |
| 324783 | 2/1991 | Japan . |

*Primary Examiner*—James W. Davie
*Attorney, Agent, or Firm*—Leydig, Voit & Mayer, Ltd.

[57] ABSTRACT

A semiconductor laser device includes a semiconductor laser chip emitting a laser light from its front facet and rear facet, a photodiode which receives the light emitted from the rear facet of said semiconductor laser chip, an upper end of the light receiving surface of said photodiode being positioned at a height equal to or lower than the light emitting position of said semiconductor laser chip. Therefore, the return light which returns the monitor photodiode is reduced and the controllability of the APC control can be enhanced.

17 Claims, 7 Drawing Sheets

SEMICONDUCTOR LASER DEVICE

FIELD OF THE INVENTION

The present invention relates to a semiconductor laser device including a semiconductor laser chip and a photodiode used as a light source in optical communication and for an optical disc.

BACKGROUND OF THE INVENTION

FIG. 7 shows a prior art semiconductor laser device. In the FIG. 7, reference numeral 100 designates a stem. Numerals 101a, 101b, and 101c designate bonding posts mounted to the stem 100. Numeral 102 designates a cap fixed to the stem 100. Numeral 103 designates a window in the cap 102. Numeral 104 designates a photodiode attaching plate fixed to the stem 100. Numeral 105 designates a submount for a photodiode fixed to the attaching plate 104. Numeral 106 designates a photodiode fixed to the submount 105. Numeral 107 designates a block fixed to the stem 100. Numeral 108 designates a submount for a semiconductor laser chip fixed to the block 107. Numeral 109 designates a semiconductor laser chip fixed to the submount 108. Numeral 110 designates light from a front facet of the semiconductor laser chip 109. Numeral 111 designates light from a rear facet of the semiconductor laser chip 109. Numeral 112 designates a returned, reflected light portion of the front facet light 110. Numerals 113a, 113b, and 113c designate wires connected to the photodiode 106 and the semiconductor laser chip 109.

The photodiode 106 and the semiconductor laser chip 109 are arranged so that the light sensitive surface of the photodiode 106 and the light emission optical axis of the semiconductor laser chip 109 are perpendicular to each other, as shown in FIG. 7.

Next, a description is given of the operation of the prior art semiconductor laser device. The semiconductor laser chip 109 facets are usually fabricated by cleaving and, therefore, a semiconductor laser chip has a front facet and a rear facet. Accordingly, when the semiconductor laser chip 109 is driven, front facet light 110 from the front facet and rear facet light 111 from the rear facet are simultaneously emitted. Since there is a linear relationship between the intensity of the front facet light 110 and the intensity of the rear facet light 111, if the rear facet light 111 is detected by the photodiode 106, a monitor current generated by the photodiode 106 is detected and the driving current to the semiconductor laser chip 109 can be controlled so that the monitor current is constant and the intensity of the front facet light 110 from the semiconductor laser chip 109 is constant. This control method is called APC (automatic power control).

Usually, the emitted light from the semiconductor laser chip is input to an optical fiber or an optical disc through an optical system, such as a lens or an isolator. Therefore, the light is reflected by an optical system, an optical fiber, or an optical disc and is returned to the semiconductor laser chip 109 as return light. The return light has two effects on the semiconductor laser device. First, light that directly returns to the front facet of the semiconductor laser chip 109 changes the oscillating characteristics of the semiconductor laser chip. Second, light directly enters the photodiode 106 and changes the monitor current. In the latter case, with APC, the monitor current of the photodiode increases and, therefore, the APC reduces the driving current to the semiconductor laser chip 109 and, as a result, the front facet light 110 from semiconductor laser chip 109 is reduced.

In the prior art semiconductor laser device, the reflected light returns and directly enters the photodiode and is mixed with the rear facet light of the semiconductor laser chip incident on the photodiode, whereby APC of the semiconductor laser device is unstable.

SUMMARY OF THE INVENTION

It is an object of the present invention to provide a semiconductor laser device with high precision APC, reducing the return light that directly enters the photodiode that monitors the light output of the semiconductor laser chip.

Other objects and advantages of the present invention will become apparent from the detailed description given hereinafter; it should be understood, however, that the detailed description and specific embodiment are given by way of illustration only, since various changes and modifications within the scope of the invention will become apparent to the those skilled in the art from this detailed description.

According to a first aspect of the present invention, a semiconductor laser device includes a semiconductor laser chip emitting laser light from a front facet and a rear facet, a photodiode detecting the light emitted from the rear facet of the semiconductor laser chip, an upper end of a light sensitive surface of the photodiode being positioned at a height at or below the light emitting position of the semiconductor laser chip. Therefore, the return light that returns to the monitor photodiode is reduced and the stability of APC is enhanced.

According to a second aspect of the present invention, in the semiconductor laser device, the semiconductor laser chip is mounted on a step shaped block adhered to the stem. Therefore, the return light that returns to the monitor photodiode is reduced and the controllability of APC is enhanced.

According to a third aspect of the present invention, in the semiconductor laser device, the light emitting position of the semiconductor laser chip coincides with the center of the stem. Therefore, the optical axis alignment of the semiconductor laser light can be easily aligned.

According to a fourth aspect of the present invention, in the semiconductor laser device, the angle between the light sensitive surface of the photodiode and the light emission optical axis of the semiconductor laser chip is 70°–110°. Therefore, high precision APC is achieved.

According to a fifth aspect of the present invention, in the semiconductor laser device, the distance between the light sensitive surface of photodiode and the rear facet of the semiconductor laser chip is less than 0.3 mm. Therefore, the return light incident on the device at an inclined angle is blocked from the photodiode by the upper electrode of the semiconductor laser chip, whereby the controllability of APC is enhanced.

According to a sixth aspect of the present invention, the semiconductor device includes a cap having an aperture for passing the light emitted from the front facet of the semiconductor laser chip, and the center of the aperture is positioned below the light emitting position of the semiconductor laser chip. Therefore, the return light incident on the device at an inclined angle is blocked from the photodiode at the non-transparent portion of the cap, whereby the controllability of APC is enhanced.

According to a seventh aspect of the present invention, in the semiconductor laser device, the light emitting position of the semiconductor laser chip coincides with the center of the stem. Therefore, the optical axis of the semiconductor laser light can be easily aligned.

According to an eight aspect of the present invention, in the semiconductor laser device, the angle between the light sensitive surface of the photodiode and the optical axis of the semiconductor laser chip is 70°–110° Therefore, high precision APC is achieved.

According to a ninth aspect of the present invention, in the semiconductor laser device, the distance between the light sensitive surface of the photodiode and the rear facet of the semiconductor laser chip is less than 0.3 mm. Therefore, the return light incident on the device at an inclined angle is blocked from the photodiode by the upper electrode of the semiconductor laser chip, whereby stability of APC is enhanced.

According to a tenth aspect of the present invention, the semiconductor laser device includes a cap having an aperture for passing light emitted from the front facet of the semiconductor laser chip. The center position of the aperture is below the light emitting position of the semiconductor laser chip. Therefore, the return light incident on the device at an inclined angle is blocked from the photodiode by the non-transparent portion of the cap, whereby stability of APC is enhanced.

According to an eleventh aspect of the present invention, in the semiconductor laser device, the angle between the light sensitive surface of the photodiode and the light emitting optical axis of the semiconductor laser chip is 70°–110°. Therefore, high precision APC is achieved.

According to a twelfth aspect of the present invention, in the semiconductor laser device, the distance between the light sensitive surface of the photodiode and the rear facet of the semiconductor laser chip is less than 0.3 mm. Therefore, the return light incident on the device at an inclined angle is blocked from the photodiode by the upper electrode of the semiconductor laser chip, whereby stability of APC is enhanced.

According to a thirteenth aspect of the present invention, the semiconductor laser device includes a cap having an aperture for passing light emitted from the front facet of the semiconductor laser chip, the center position of the aperture being below the light emitting position of the semiconductor laser chip. Therefore, the return light incident on the device at an inclined angle is blocked from the photodiode by the non-transparent portion of the cap, whereby stability of APC is enhanced.

According to a fourteenth aspect of the present invention, in the semiconductor laser device, the distance between the light sensitive surface of the photodiode and the rear facet of the semiconductor laser chip is less than 0.3 mm. Therefore, the return light incident on the device at an inclined angle is blocked from the photodiode by the upper electrode of the semiconductor laser chip, whereby stability of APC is enhanced.

According to a fifteenth aspect of the present invention, the semiconductor laser device includes a cap having an aperture for passing the light emitted from the front facet of the semiconductor laser chip, the center of the aperture being below the light emitting position of the semiconductor laser chip. Therefore, the return light incident on the device at an inclined angle is blocked from the photodiode by the non-transparent portion of the cap, whereby stability of APC is enhanced.

According to a sixteenth aspect of the present invention, the semiconductor laser device includes a cap having an aperture for passing the light emitted from the front facet of the semiconductor laser chip, the center position of the aperture being below the light emitting position of the semiconductor laser chip. Therefore, the return light incident on the device at an inclined angle is blocked from the photodiode by the non-transparent portion of the cap, whereby stability of APC is enhanced.

According to a seventeenth aspect of the present invention, a semiconductor laser device comprises a semiconductor laser chip that emits laser light from a front facet and a rear facet; a photodiode for detecting light emitted from the rear facet of the semiconductor laser chip, the light emitted from the rear facet of the semiconductor laser chip reaching the light sensitive surface of the photodiode and an upper end of the light sensitive surface of the photodiode positioned within a range of ±100 μm of the upper side of a light spot size (half value width of 1/e of the peak power). Therefore, a large portion of the light emitted from the rear facet of the semiconductor laser chip can be incident on the photodiode, whereby the S/N ratio can be large and stability of APC is enhanced.

According to an eighteenth aspect of the present invention, a semiconductor laser device comprises a semiconductor laser chip emitting laser light from a front facet and a rear facet; a photodiode for detecting light emitted from the rear facet of the semiconductor laser chip; a cap having an aperture for passing the light emitted from the front facet and provided with a window at the aperture for transmitting the emitted light from the front facet, the radius of the aperture of the cap being larger than twice the spot size when the emitted light from the front facet reaches the window and smaller than a size obtained by adding 200 μm to the spot size. Therefore, a larger portion of the return light can be blocked by the cap, whereby stability of APC is enhanced.

DETAILED DESCRIPTION OF THE PREFERRED EMBODIMENTS

Embodiment 1

Figure 1:
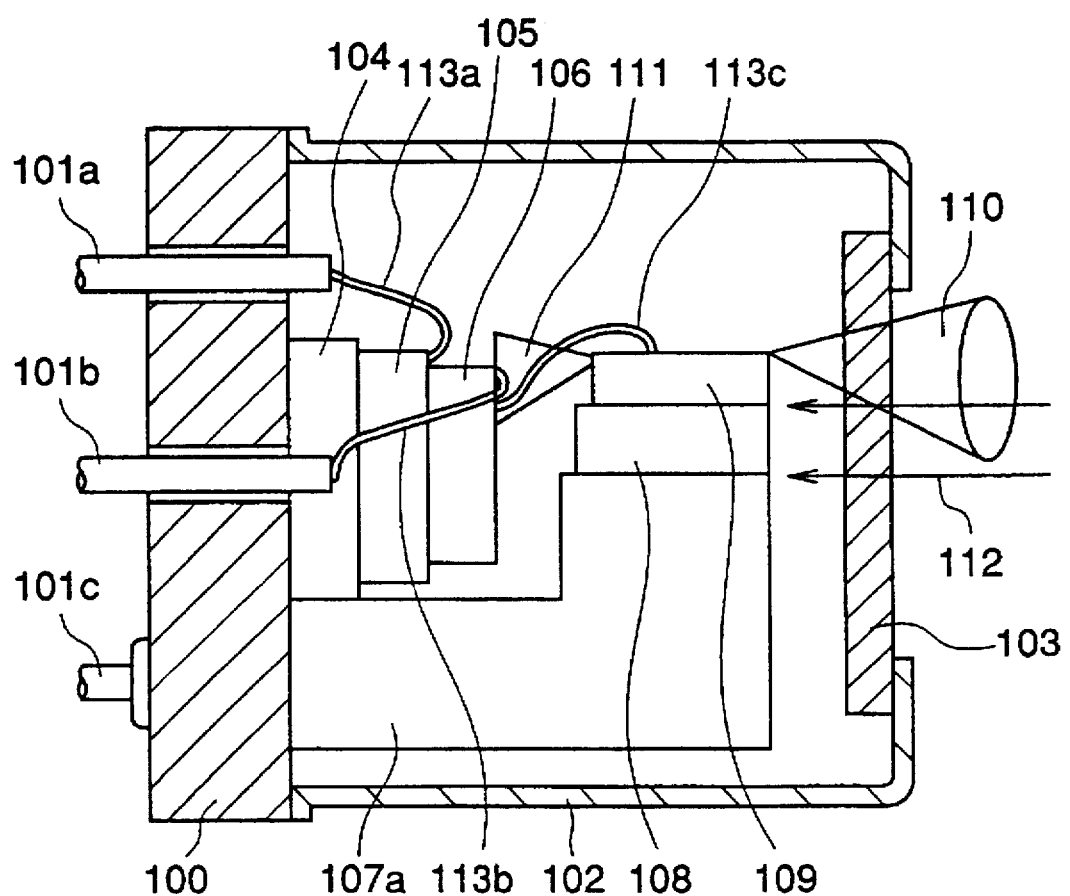
FIG. 1 is a cross section of a semiconductor laser device of a first embodiment of the present invention.

FIG. 1 is a diagram illustrating a semiconductor laser device according to a first embodiment of the present invention. In FIG. 1, numeral 100 designates a stem, numerals 101a, 101b, and 101c designate bonding posts mounted in the stem 100. Numeral 102 designates a cap fixed to the stem 100. Numeral 103 designates a glass window in the cap 102. Numeral 104 designates a photodiode fixing plate adhered to the stem 100. Numeral 105 designates a photodiode submount fixed to the attaching plate 104, numeral 106 designates a photodiode fixed to the submount 105, numeral 107a designates a stepped block fixed to the stem 100, numeral 108 designates a semiconductor laser chip submount fixed to the stepped block 107a, numeral 109 designates a semiconductor laser chip fixed to the submount 108, numeral 110 designates front facet light emitted from the semiconductor laser chip 109, numeral 111 designates rear facet light emitted from the semiconductor laser chip 109, numeral 112 designates return light, i.e., a reflected portion of the front facet light 110, and numerals 113a, 113b, and 113c designate wires connected to the photodiodes 106 and the semiconductor laser chip 109.

The photodiode 106 and the semiconductor laser chip 109 are arranged so that the light sensitive facet of the photodiode 106 and the light emission optical axis of the semiconductor laser chip 109 intersect each other as shown in FIG. 1. Here, the face and the axis may be arranged not perpendicular to each other but intersecting each other at an angle of 70° to 110°. In addition, the stepped block 107a is high at the side of the semiconductor laser chip 109 and low at the side of the photodiode 106.

In this first embodiment, the semiconductor laser chip 109 is mounted via a submount 108 on the stepped block 107a, and the light emitting point of the semiconductor laser chip 109 is higher than the stepped block 107a by the height of the step. Therefore, the upper electrode (the face to which the wire 113c is bonded) of the laser chip 109 is at a higher position than the upper edge of the light sensitive surface of the monitor photodiode 106. Accordingly, even when there is return light 112 due to reflection, the monitor photodiode 106 is shielded by the semiconductor laser chip 109, the submount 108, and the stepped block 107a, and reflected light does not enter the monitor photodiode 106. On the other hand, about half of the rear facet light 111 emitted from the rear facet of the semiconductor laser chip 109 enters the monitor photodiode 106.

In the semiconductor laser device of this embodiment, the quantity of the rear facet light 111 that enters the monitor photodiode 106 is smaller than that in the prior art structure that does not use the stepped block 107a. However, because the return light 112 does not enter the monitor photodiode 106, stability of the APC control can be enhanced.

Embodiment 2

Figure 2:
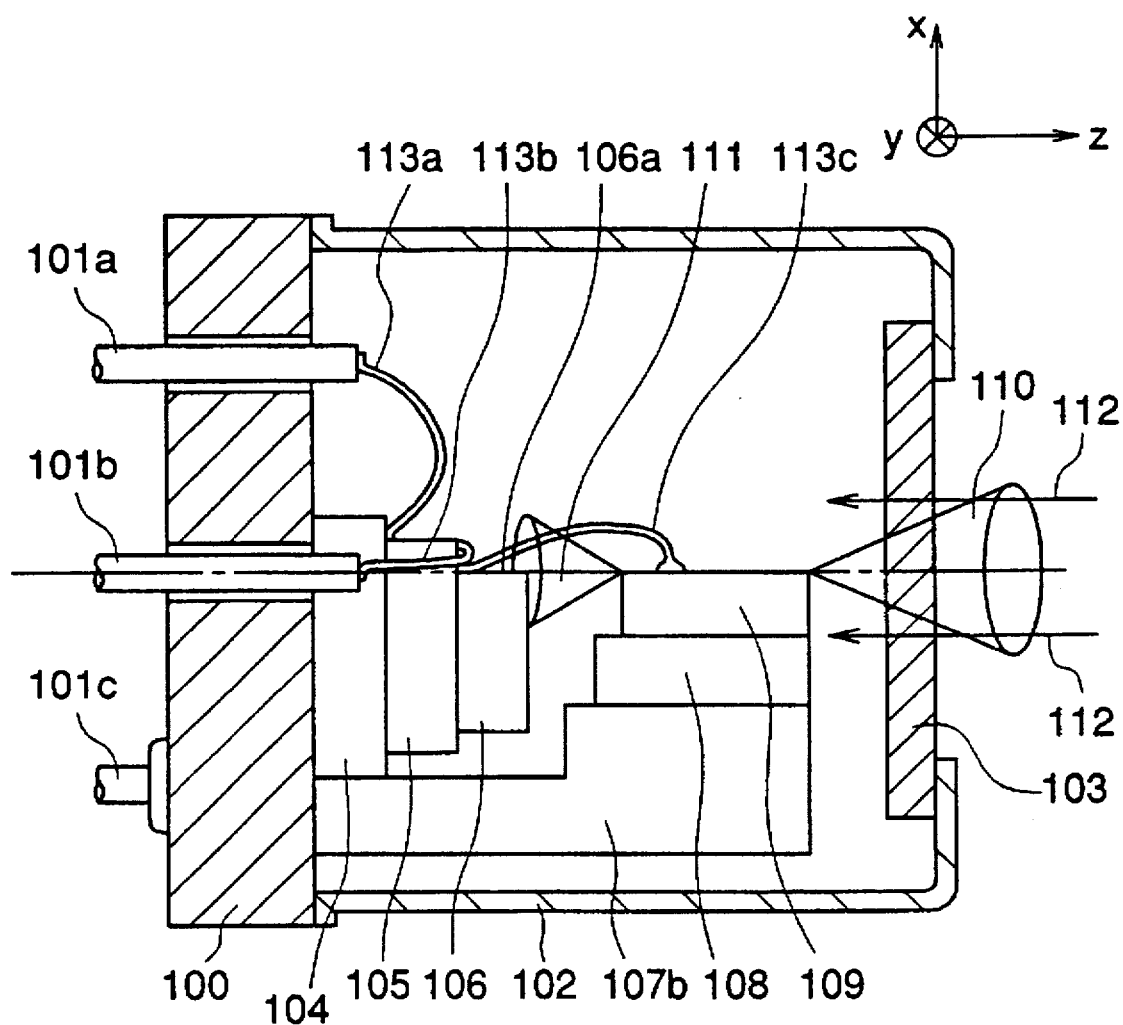
FIG. 2 is a cross section of a semiconductor laser device of a second embodiment of the present invention.

FIG. 2 shows a semiconductor laser device according to a second embodiment of the present invention. In FIG. 2, numeral 107b designates a stepwise block fixed to a stem, and numeral 106a designates an upper sidewall of the photodiode 106. The other reference numerals are the same as those in FIG. 1.

In the semiconductor laser device of this second embodiment, the photodiode fixing plate 104 is directed downward (−x direction) and the sidewall upper end 106a of the photodiode 106 fixed via the photodiode submount 105 is located opposite the center of the stem 100. In addition, the stepped block 107b is thin and the light emitting point of the semiconductor laser chip 108 mounted via the semiconductor laser chip submount 109 is coincident with the center of the stem 100.

In this second embodiment, the return light 112 is shielded by the semiconductor laser chip 109, the semiconductor laser chip submount 108, and the stepped block 107b and does not enter the monitor photodiode 106, whereby stability of APC is enhanced.

Furthermore, the optical axis of the emitted light of the semiconductor laser chip 109 coincides with the center line of the stem 100 so that the positional alignment with the optical system, such as a lens or an isolator, can be performed with the outer configuration of the stem 100 as a reference, whereby the optical axis adjustment of the optical system is simplified.

Embodiment 3

Figure 3:
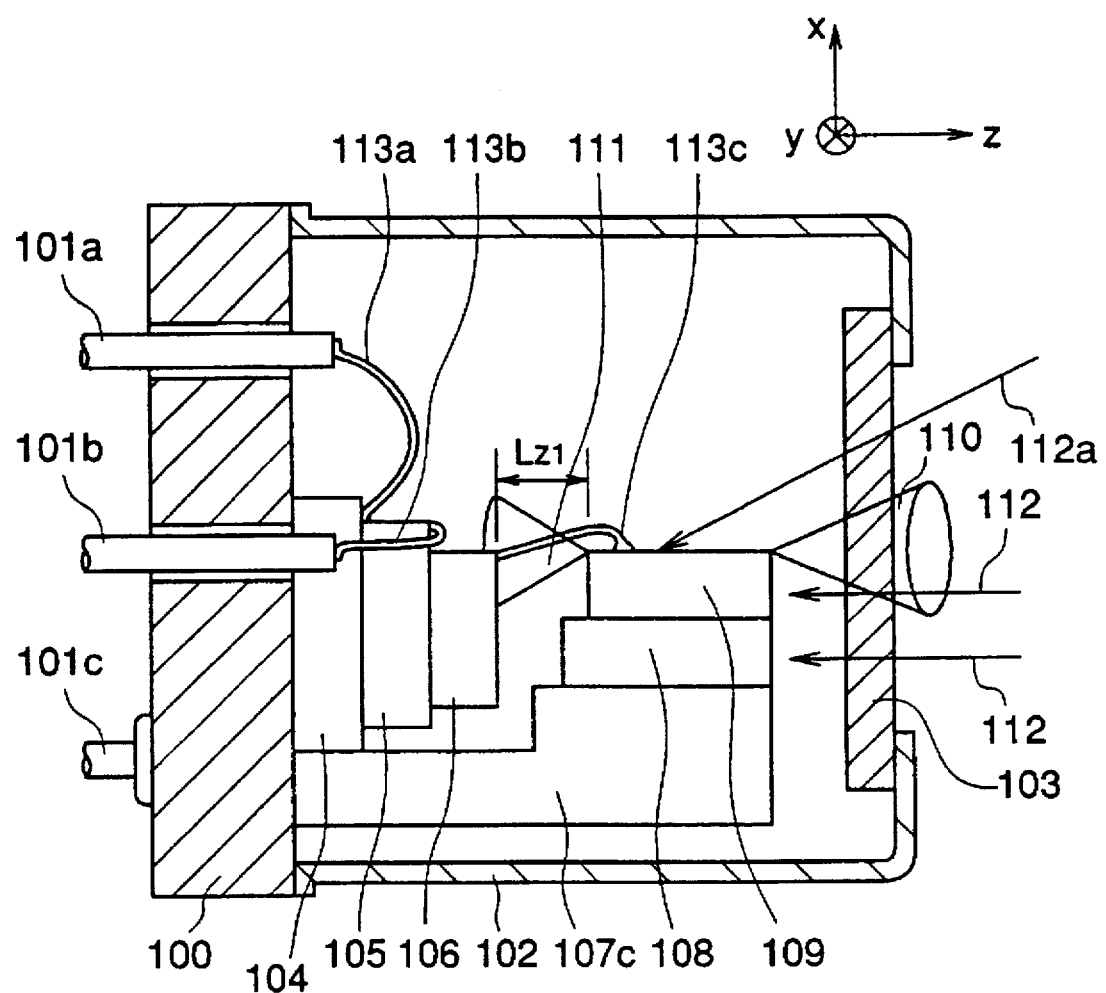
FIG. 3 is a cross section of a semiconductor laser device of a third embodiment of the present invention.

FIG. 3 is a diagram illustrating a semiconductor laser device according to a third embodiment of the present invention. In FIG. 3, numeral 107c designates a stepped block, numeral 112a designates reflected return light incident at an inclined angle. The other elements are the same as those shown in FIG. 1.

The front facet light 110 emitted from the front facet of the semiconductor laser chip 109 is reflected by optical parts, such as a lens, an optical fiber, or an optical disc, as return light 112. The return light has angular components and with an inclined incidence shown in FIG. 3. In such a case, even when the upper end of the light sensitive surface of the photodiode 106 is lower than the upper electrode of the semiconductor laser chip 109, the return light 112a at the inclined angle incidence is incident on the photodiode 106, whereby correct APC cannot be performed.

In this third embodiment, the distance $L_{z1}$ between the rear facet of the semiconductor laser chip 109 and the light sensitive surface of the photodiode 106 is less than 0.3 mm, whereby the return light 112a at the inclined angle incidence is shielded by the upper electrode of the semiconductor laser chip 109 and does not enter the monitor photodiode 106. While the distance $L_{z1}$ between the rear facet of the semiconductor laser chip 109 and the light sensitive surface of the photodiode 106 is better if shorter, it is sufficient if the distance is less than 0.3 mm. This distance can be realized by adjusting the thicknesses of the photodiode attaching plate 104, the photodiode submount 105, and the photodiode 106, and adjusting the length of the stepped block 107c on which the semiconductor laser chip 109 is mounted.

In this third embodiment, since the distance $L_{z1}$ between the rear facet of the semiconductor laser chip 109 and the light sensitive surface of the photodiode 106 is less than 0.3 mm, the return light 112a at the inclined angle incidence is shielded by the upper electrode of the semiconductor laser chip 109 and does not enter the monitor photodiode 106, whereby stability of APC is enhanced.

Embodiment 4

Figure 4:
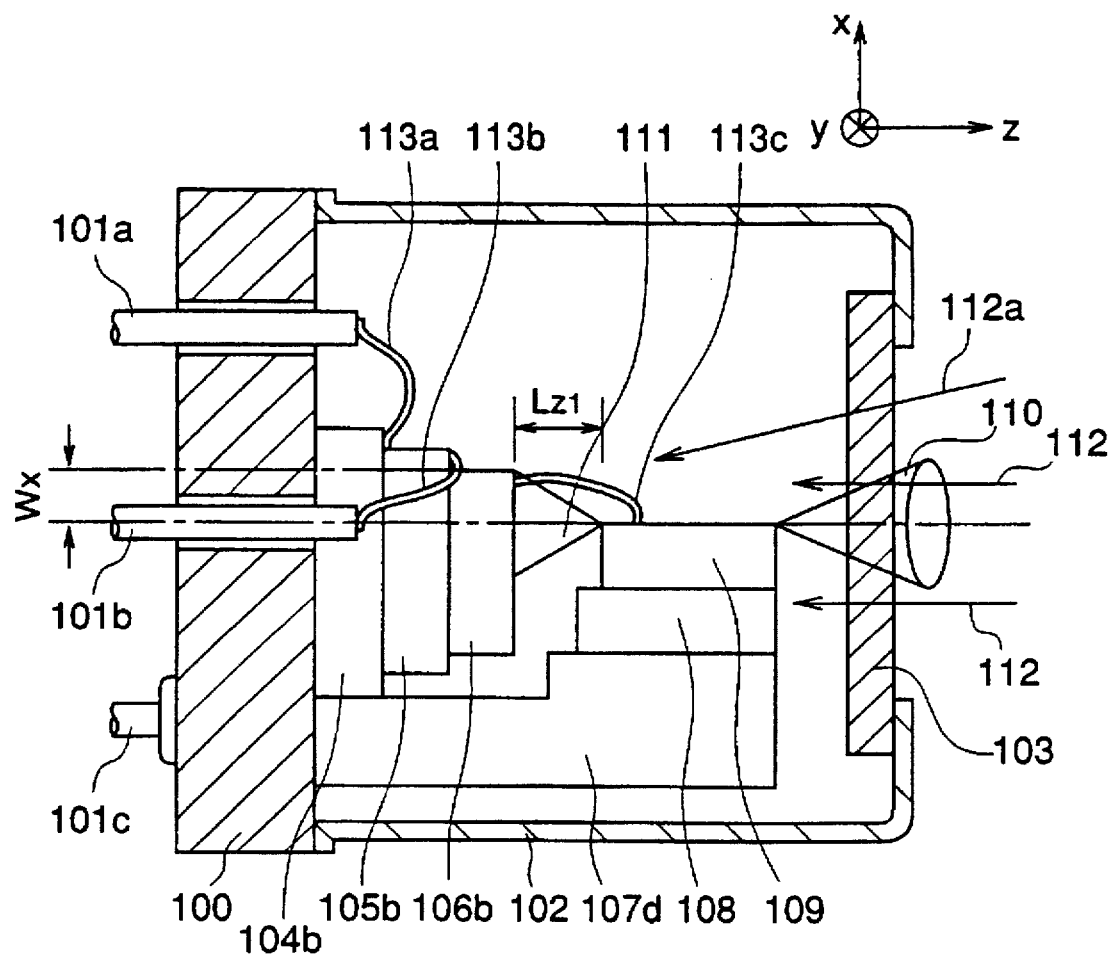
FIG. 4 is a cross section of a semiconductor laser device of a fourth embodiment of the present intention.

FIG. 4 shows a semiconductor laser device according to a fourth embodiment of the present invention. In FIG. 4, numeral 104b designates a photodiode attaching plate fixed to the stem 100. Numeral 105b designates a photodiode submount fixed to the attaching plate 104b, numeral 105b designates a photodiode submount fixed to the fixing plate 104b. Numeral 106b designates a photodiode fixed to the submount 105b. Numeral 107d designates a stepped block fixed to the stem 100. The other reference numbers are the same as in FIG. 1.

The light intensity distribution ∅(x) emitted from the front facet light 110 and rear facet light 111 emitted from the semiconductor laser chip 109 has a Gaussian distribution. Accordingly, the light intensity distribution ∅(x) is:

$$\emptyset(x) = A \, exp\{-(x/\omega)_2\} \quad (1).$$

Here, A is a constant and ω is a spot size (a half value width at 1/e of the peak power). This spot size changes as the light propagates. When light is emitted from the semiconductor laser chip 109, the spot becomes larger as it becomes farther from the facet of the semiconductor laser chip 109. In addition, as is apparent from formula (1), in the light intensity distribution ∅(x), the light intensity distribution included in the spot size amounts to about 0.7–0.8 of the whole. Accordingly, a larger portion of the light can be included in this spot size.

For example, when the distance between the rear facet of the semiconductor laser chip 109 and the photodiode 106b is $L_{z2}$, it is supposed that the spot size of the rear facet light 111 on the light sensitive surface of the photodiode 106b becomes $2\omega_0$. Then, the semiconductor laser chip 109 and the photodiode 106b are fixed to positions such that the upper end of the light sensitive surface of the photodiode 106b is positioned only $W_x$ in the +x direction from the position of the light emitting point of the semiconductor laser chip 109. In the positional alignment, the spot size $\omega_0$ and the fixing position deviation of $2W_x$ are equal to each other. This positional alignment is achieved by adjusting the photodiode fixing plate 104b, the photodiode submount 105b, the photodiode 106b, and the stepped block 107d. When it is so constructed, a larger portion of the light emitted from the rear facet of the semiconductor laser chip 109 can be received by the monitor photodiode 106b.

In this fourth embodiment, since the upper end of the light sensitive surface of the photodiode 106b is spaced from the upper electrode of the laser diode in the +x direction, some return light 112 enters the light sensitive surface of the photodiode 106b. However, since a larger portion of the rear facet light 111 of semiconductor laser chip 109 is received by the photodiode 106b, the S/N ratio, where the rear facet light 111 that enters the light sensitive surface of the photodiode 106b is a signal (S) and the return light 112 that enters the light sensitive surface of the photodiode 106b is noise (N), can be increased and, as a result, stability of APC can be improved.

Embodiment 5

Figure 5:
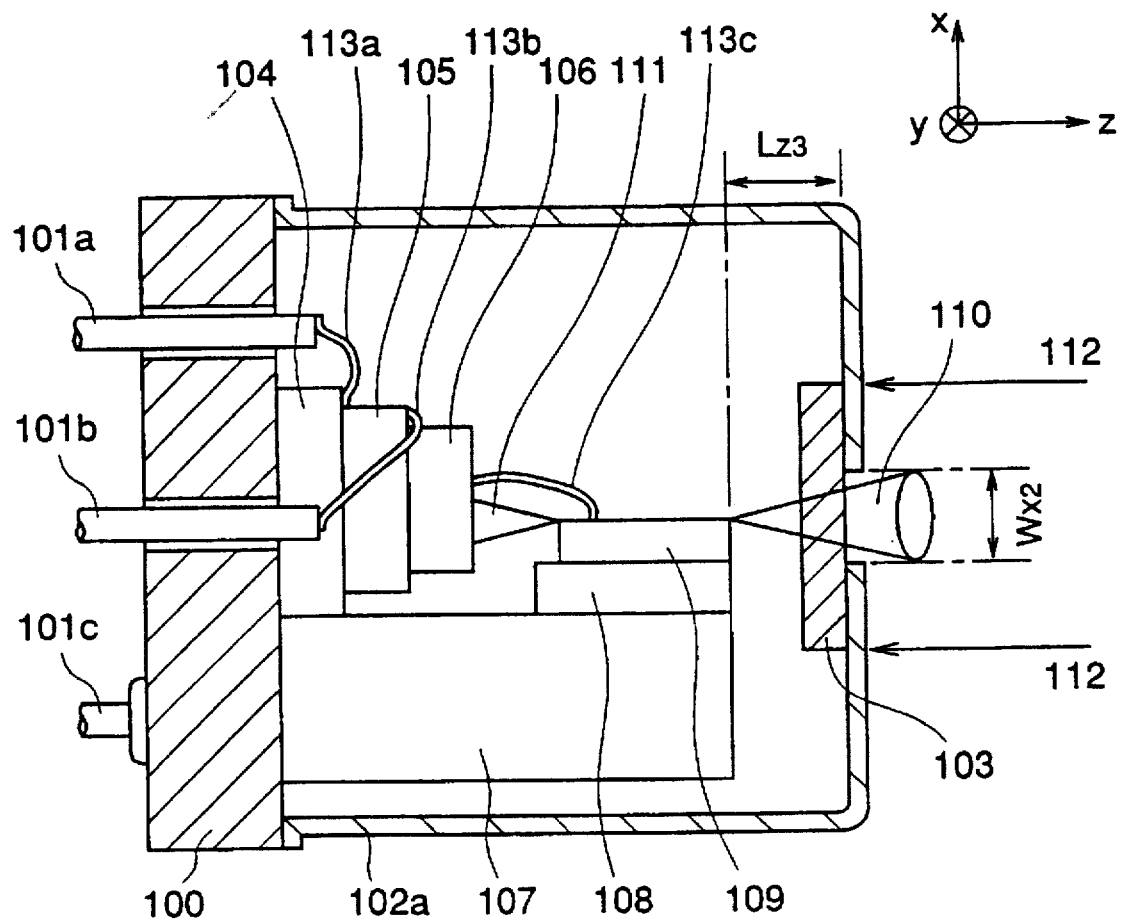
FIG. 5 is a cross section of a semiconductor laser device of a fifth embodiment of the present invention.

FIG. 5 shows a semiconductor laser device according to a fifth embodiment of the present invention. In FIG. 5, numeral 102a designates a cap having an opening of $W_{x2}$ for the window 103. The other reference numerals designate the same elements as in the first embodiment.

When the distance from the front facet of the semiconductor laser chip 109 to the internal surface of the cap 102a is $L_{z3}$, the spot size when the front facet light 110 transits $L_{z3}$ is $\omega_{01}$. Then, the aperture width $W_{x2}$ of the window 103 of the cap 102a is:

$$W_{x2}/2 = \omega_{01}.$$

In this fifth embodiment, a larger portion of the front facet light 110 emitted from the front facet of the semiconductor laser chip 109 is emitted outside of the cap 102a. On the other hand, the return light 112 cannot enter the cap 102a or hardly enters because the aperture width $W_{x2}$ of the cap 102a is narrow. Accordingly, by reducing the return light 112 incident on the monitor photodiode, stability of APC can be enhanced.

Embodiment 6

Figure 6:
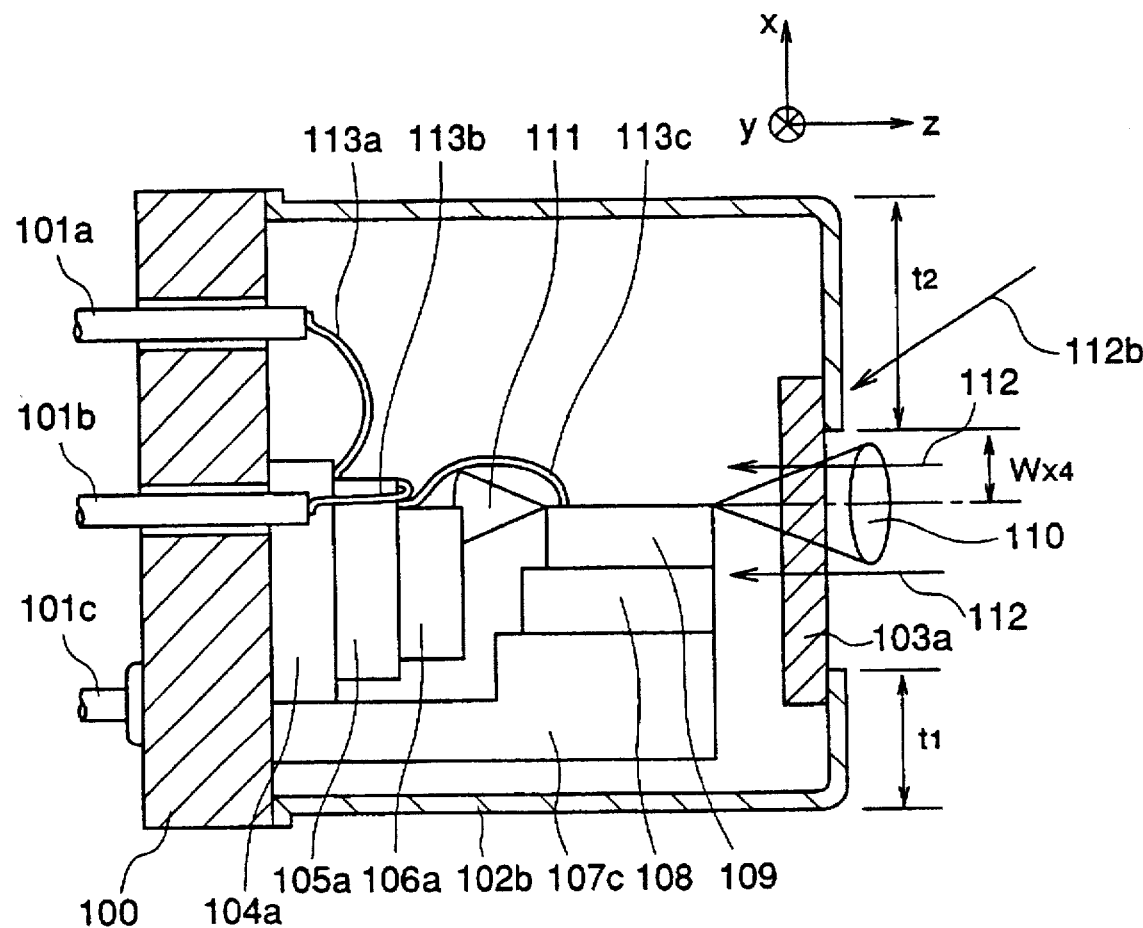
FIG. 6 is a cross section of a semiconductor laser device of a sixth embodiment of the present invention.
Figure 7:
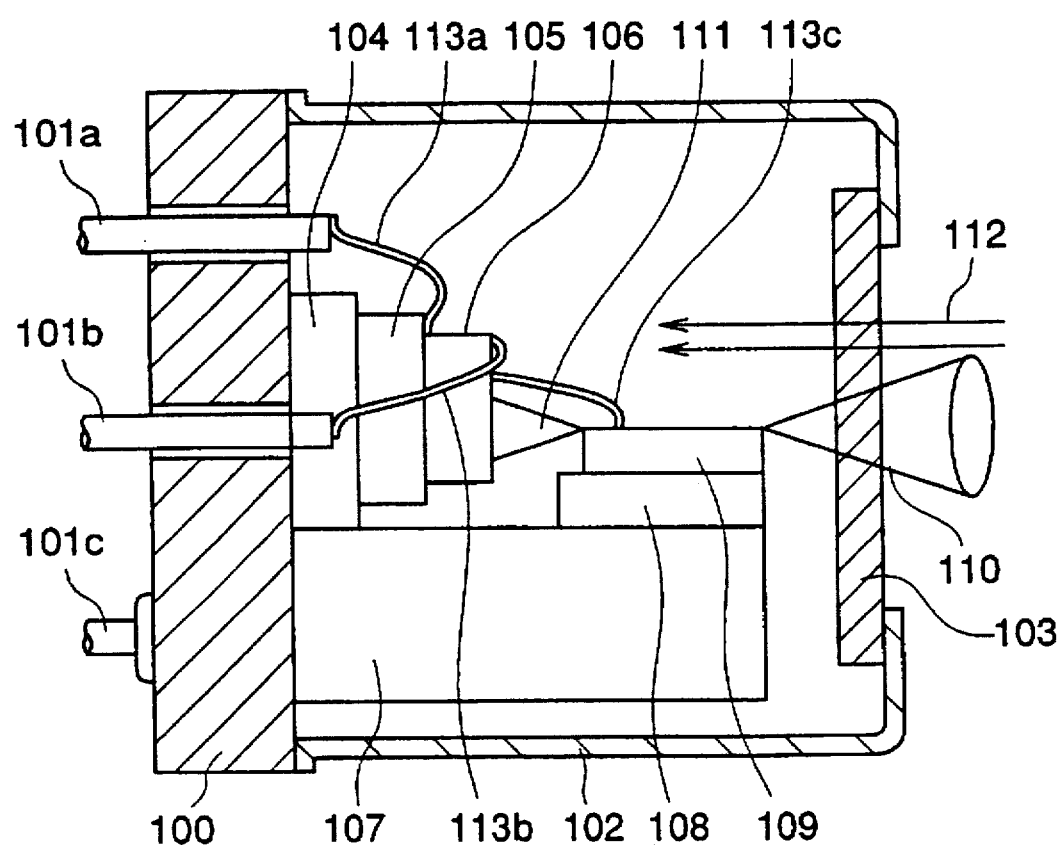
FIG. 7 is a cross section of a prior art semiconductor laser device.

FIG. 6 is a diagram showing a semiconductor laser device according to a sixth embodiment of the present invention. In FIG. 6, reference numeral 102b designates a cap, and the length of the portion of the non-transparent part positioned upwards and downwards of the window 103a is $t_2$ at the +x side and is $t_1$ at the -x side, respectively ($t_2 > t_1$). Numeral 112b designates return light having an inclined angle of incidence.

In this sixth embodiment of the present invention, since the length of the nontransparent part at the +x side of the cap 102b is long, $t_2$ as shown in FIG. 6, the return light 112b having the inclined angle of incidence is shielded by the non-transparent part. In addition, since the distance $W_{x4}$ from the light emitting position of the semiconductor laser chip 109 to the cap aperture end at the +x side is larger than the spot size $\omega_{01}$ at the +x side of the aperture part, the front facet light 110 is emitted outside of the cap 102b without being shielded by the non-transparent part of the cap 102b.

In this sixth embodiment, since the return light 112b having the inclined angle of incidence is shielded by the non-transparent part of the cap 102b, and stability of APC is enhanced.

Embodiment 7

The seventh embodiment of the present invention is described in connection with the fourth embodiment except that in the seventh embodiment the difference between the spot size $\omega_0$ and the fixing position deviation $W_x$ of the photodiode 106b is within ±100 µm.

In this embodiment, as shown in FIG. 4, the spot size $\omega_0$ and the fixing position deviation $W_x$ are coincident. However, if the difference between the spot size $\omega_0$ and the fixing position deviation $W_x$ is within ±100 µm, sufficient light can be detected by the monitor photodiode 106b, and the S/N ratio can be made large for high precision APC.

Embodiment 8

In the eighth embodiment of the present invention, the radius of the aperture, $W_{x2}/2$ of the window 103 is less than the spot size $\omega_{01}$ of the front facet light 110 by +100 µm, i.e., the aperture $W_{x2}$ is made less than twice of the spot size $\omega_{01}+200$ µm.

In this eighth embodiment, as shown in figure 5, the half of the aperture $W_{x2}$ is made equal to the spot size $\omega_{01}$. In the semiconductor laser device of this eighth embodiment, if $W_{x2}$ is less than twice the spot size $\omega_{01}+200$ µm, the return light 112 can be sufficiently blocked by the cap 102a, and stability of APC is enhanced.

What is claimed is:

1. A semiconductor laser device comprising:

a laser mount;

a semiconductor laser chip for emitting laser light from a front facet and from a rear facet along an optical axis, the semiconductor laser chip having opposed, generally planar top and bottom surfaces transverse to the front and rear facets and being mounted at the bottom surface to the laser mount; and a photodiode positioned for detecting the laser light emitted from the rear facet of said semiconductor laser chip, the photodiode having a light sensitive surface terminating at an edge, the edge being positioned opposite the rear facet of the semiconductor laser chip between planes respectively including the top and bottom surfaces whereby the photodiode is shielded by the semiconductor laser chip from laser light emitted from the front facet and reflected toward the semiconductor laser chip.

2. The semiconductor laser device of claim 1 including a stem wherein the laser mount includes a stepped block adhered to the stem, the semiconductor laser chip being mounted on the block.

3. The semiconductor laser device of claim 1 including a stem on which the laser mount and photodiode are mounted, the stem having a center, the light emitting point of the rear facet of the semiconductor laser chip being aligned with the center of the stem.

4. The semiconductor laser device of claim 1 wherein the light sensitive surface of the photodiode and the optical axis of said semiconductor laser chip form an angle of 70°–110°.

5. The semiconductor laser device of claim 1 wherein the light sensitive surface of the photodiode and the rear facet of the semiconductor laser chip are separated by less than 0.3 mm.

6. The semiconductor laser device of claim 1 including a cap having an aperture for passing light emitted from the front facet of the semiconductor laser chip, the aperture having a center offset from the optical axis of the semiconductor laser chip.

7. The semiconductor laser device of claim 2 wherein the stem has a center and the light emitting point of the rear facet of the semiconductor laser chip is aligned with the center of the stem.

8. The semiconductor laser device of claim 2 wherein the light sensitive surface of the photodiode and the optical axis of the semiconductor laser chip form an angle of 70°–110°.

9. The semiconductor laser device of claim 2 wherein the light sensitive surface of the photodiode and the rear facet of the semiconductor laser chip are separated by less than 0.3 mm.

10. The semiconductor laser device of claim 2 including a cap having an aperture for passing light emitted from the front facet of the semiconductor laser chip, the aperture having a center offset from the optical axis of the semiconductor laser chip.

11. The semiconductor laser device of claim 3 wherein the light sensitive surface of the photodiode and the optical axis of the semiconductor laser chip form an angle of 70°–110°.

12. The semiconductor laser device of claim 3 wherein the light sensitive surface of the photodiode and the rear facet of the semiconductor laser chip are separated by less than 0.3 mm.

13. The semiconductor laser device of claim 3 including a cap having an aperture for passing light emitted from the front facet of the semiconductor laser chip, the aperture having a center offset from the optical axis of the semiconductor laser chip.

14. The semiconductor laser device of claim 4 wherein the light sensitive surface of the photodiode and the rear facet of the semiconductor laser chip are separated by less than 0.3 mm.

15. The semiconductor laser device of claim 4 including a cap having an aperture for passing light emitted from the front facet of the semiconductor laser chip, the aperture having a center offset from the optical axis of the semiconductor laser chip.

16. The semiconductor laser device of claim 5 including a cap having an aperture for passing light emitted from the front facet of the semiconductor laser chip, the aperture having a center offset from the optical axis of the semiconductor laser chip.

17. A semiconductor laser device comprising:

a semiconductor laser chip for emitting a laser light beam from a front facet and a laser light beam from a rear facet along an optical axis; and a photodiode positioned for detecting light emitted from the rear facet of the semiconductor laser chip, the photodiode having a light sensitive surface terminating at an edge, wherein light emitted from the rear facet of the semiconductor laser chip reaches the light sensitive surface of the photodiode, and the edge of the light detecting surface of the photodiode is positioned within ±100 µm of a point 1/e of a peak intensity of the laser light beam emitted from the rear facet of the semiconductor laser chip.

* * * * *